(12) United States Patent
West et al.

(10) Patent No.: US 8,575,758 B2
(45) Date of Patent: Nov. 5, 2013

(54) LASER-ASSISTED CLEAVING OF A RECONSTITUTED WAFER FOR STACKED DIE ASSEMBLIES

(75) Inventors: Jeffrey Alan West, Dallas, TX (US); Margaret Simmons-Matthews, Richardson, TX (US); Raymundo M. Camenforte, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 200 days.

(21) Appl. No.: 13/197,856

(22) Filed: Aug. 4, 2011

(65) Prior Publication Data
US 2013/0032946 A1    Feb. 7, 2013

(51) Int. Cl.
*H01L 23/498*    (2006.01)
(52) U.S. Cl.
USPC ........... 257/774; 257/777; 257/686; 257/723; 257/E21.599; 438/113; 438/629; 438/637; 438/639
(58) Field of Classification Search
USPC .......... 257/774, 777, 686, 723, 724, E23.067, 257/E21.599; 438/113, 629, 637, 639, 675
See application file for complete search history.

(56) References Cited

U.S. PATENT DOCUMENTS

| | | | |
|---|---|---|---|
| 7,838,337 B2 * | 11/2010 | Marimuthu et al. | 438/110 |
| 7,901,967 B2 * | 3/2011 | Komura et al. | 438/33 |
| 2007/0007641 A1 * | 1/2007 | Lee et al. | 257/691 |
| 2007/0111478 A1 * | 5/2007 | Komura et al. | 438/462 |
| 2010/0279463 A1 | 11/2010 | Hsiao et al. | |
| 2010/0326702 A1 * | 12/2010 | Dang et al. | 174/250 |
| 2011/0068459 A1 * | 3/2011 | Pagaila et al. | 257/698 |

* cited by examiner

*Primary Examiner* — Thinh T Nguyen
(74) *Attorney, Agent, or Firm* — Steven A. Shaw; W. James Brady; Frederick J. Telecky, Jr.

(57) ABSTRACT

A method of forming stacked die devices includes attaching first semiconductor die onto a wafer to form a reconstituted wafer, and then bonding second semiconductor die onto the first semiconductor die to form a plurality of singulated stacked die devices on the wafer. A support tape is attached to a bottomside of the second semiconductor die. A dicing tape is attached to the wafer. The wafer is laser irradiated before or after attachment of the dicing tape at intended dicing lanes that align with gaps between the first semiconductor die to mechanically weaken the wafer at the intended dicing lanes, but not cut through the wafer. The dicing tape is pulled to cleave the wafer into a plurality of singulated portions to form a plurality of singulated stacked die devices attached to the singulated wafer portions by the dicing tape. The support tape is removed prior to cleaving.

9 Claims, 11 Drawing Sheets

LASER-ASSISTED CLEAVING OF A RECONSTITUTED WAFER FOR STACKED DIE ASSEMBLIES

FIELD

Disclosed embodiments relate to stacked die assembly methods that utilize reconstituted wafers.

BACKGROUND

Conventional stacked die assembly methods involve die-to-die (D2D) assembly when the top die extends beyond the perimeter or boundary (e.g., area) of the bottom die. Die-to-wafer (D2W) assembly, however, is preferable to D2D for cost reasons. One option to enable D2W assembly for such die stacks is to space out the lower die on the semiconductor wafer to allow D2W bonding. However, the large gaps between the lower die results in a loss of otherwise available die area. Another D2W option involves creating a "reconstituted wafer" formed by bonding the smaller die to a carrier wafer to achieve the needed spacing prior to bonding the top die thereon.

SUMMARY

Disclosed embodiments recognize that using conventional mechanical dicing operations for forming stacked die assemblies using the reconstituted wafer method, as the dicing blade comes in close proximity to the periphery bond pads on the top semiconductor die, a debris-comprising slurry can be deposited thereon. The debris-comprising slurry can damage or contaminate exposed periphery pads which can prevent reliable wirebonding thereto. Damage and contamination of periphery bond pads on the top semiconductor die has been found to be more problematic when the first semiconductor die is relatively thin (e.g., <120 µm) and the gap between die is small (e.g., <25 µm).

Disclosed embodiments include laser-assisted cleaving of a reconstituted wafer for forming stacked die assemblies that singulate the stacked die without damaging or contaminating the periphery bond pads of the top die. One disclosed embodiment is a method of forming stacked die devices that includes attaching a plurality of first semiconductor die onto a surface of a wafer to form a reconstituted wafer, and then bonding a plurality of second semiconductor die with their topside down onto the plurality of first semiconductor die to form a plurality of singulated stacked die devices attached to the wafer. The wafer can comprise a carrier wafer or a wafer including a plurality of interposer die. A support tape is attached to a bottomside of the plurality of second semiconductor die.

A laser is used to irradiate the carrier wafer at intended dicing locations that align with gaps between the plurality of first semiconductor die under conditions that mechanically weaken the wafer, but does not cut through the intended dicing lanes. A dicing tape is applied either before or after laser irradiating. The dicing tape is pulled resulting in cleaving (separation of) the wafer along the intended dicing lanes into a plurality of singulated portions. The support tape is removed prior to cleaving, which generally occurs while pulling/stretching the dicing tape. Each singulated portion is attached to the dicing tape and includes one of the plurality of singulated stacked die devices on a wafer portion. The singulated stacked die devices can then be removed from the dicing tape and, in one example embodiment, attached to a package substrate such as a lead frame, followed by wire bonding.

DETAILED DESCRIPTION

Figure 1:
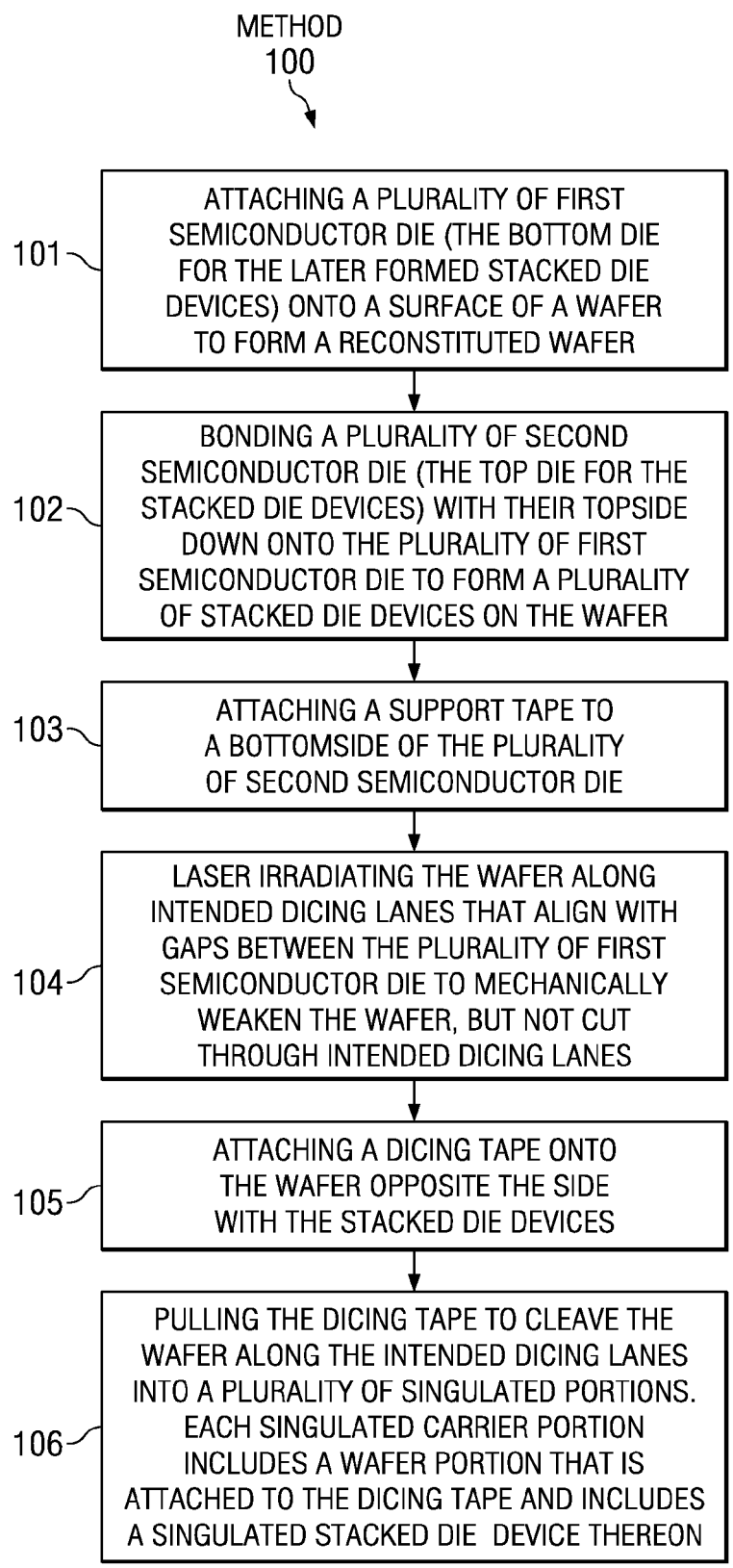
FIG. 1 is a flow chart that shows steps in an example method for forming stacked die devices including laser-assisted cleaving of a reconstituted wafer, according to an example embodiment.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

Disclosed embodiments include laser-assisted cleaving of a reconstituted wafer for forming stacked die assemblies where the singulating of the stacked die does not damage or contaminate the exposed periphery pads on the top die. Disclosed embodiments also include stacked die devices that comprise an interposer die (e.g., silicon or quartz interposer) including a plurality of through substrate vias (TSVs), and a die stack attached to the interposer. The die stack includes a second semiconductor die bonded with its topside down onto a first semiconductor die. The edges of the interposer die include laser damaged regions including micro cracks.

FIG. 1 is a flow chart that shows steps in an example method 100 for forming stacked die devices including laser-assisted cleaving of a reconstituted wafer, according to an example embodiment. Step 101 comprises attaching a plurality of first semiconductor die onto a surface of a wafer to form a reconstituted wafer. The first semiconductor die can include a plurality of TSVs. The wafer can comprise a silicon carrier wafer or a glass carrier wafer, such as quartz glass, silica glass or a tempered soda-lime glass such as PYREX®. In another embodiment the wafer comprises a plurality of interposer die, such as silicon or glass interposer die that include TSVs.

Figure 2A:
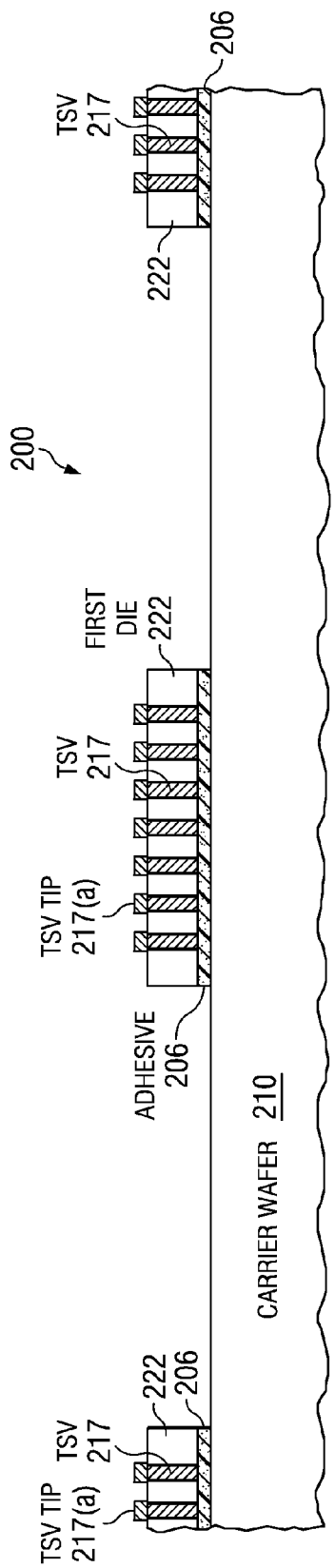
FIG. 2A is a cross sectional depiction of the arrangement following attaching a plurality of first semiconductor die onto a surface of a wafer to form a reconstituted wafer according to an example embodiment.

FIG. 2A is a cross sectional depiction of the arrangement 200 following step 101 that shows a reconstituted wafer comprising a plurality of first semiconductor die 222 attached to a surface of a wafer 210 shown as a carrier wafer 210. Although wafer 210 is shown as a carrier wafer in FIGS. 2A-2F, in other embodiments wafer 210 comprises a plurality of interposer die, such as interposer die including TSVs. Although not shown, the bottomside of first die 222 (side having protruding TSV tips 217(a)) includes a dielectric layer lateral to the TSV tips 217(a).

The carrier wafer 210 is generally 280 to 750 µm thick. The first semiconductor die 222 can be seen to include TSVs 217 including protruding TSV tips 217(a). A permanent or temporary adhesive (e.g., an epoxy) 206 secures the first semiconductor die 222 to the carrier wafer 210.

Step 102 comprises bonding a plurality of second semiconductor die with their topside down onto the plurality of first semiconductor die to form a plurality of stacked die devices on the wafer 210. The second semiconductor die can extend beyond the perimeter or boundary of the first semiconductor die and the topside of the second semiconductor die can include bond pads in this extended region for the stacked die devices. Thermo-compression (TC) bonding is one example bonding method that may be used in step 102.

"Extend beyond the perimeter or boundary of the first semiconductor die" includes the case the second semiconductor die is larger in area as compared to the first semiconductor die, as well as other arrangements. For example, in a first arrangement the second semiconductor die can be rectangular and smaller in area as compared to the first semiconductor die, but has two sides that extend beyond the first semiconductor in one dimension. In a second arrangement, the second semiconductor die is offset relative to the first semiconductor die such that some of the top second semiconductor die hangs over the first semiconductor die. This second arrangement may be used, for example, on stacked memories, where the equal sized die are offset back and forth up the stack to allow access to periphery bond pads on the top die.

Figure 2B:
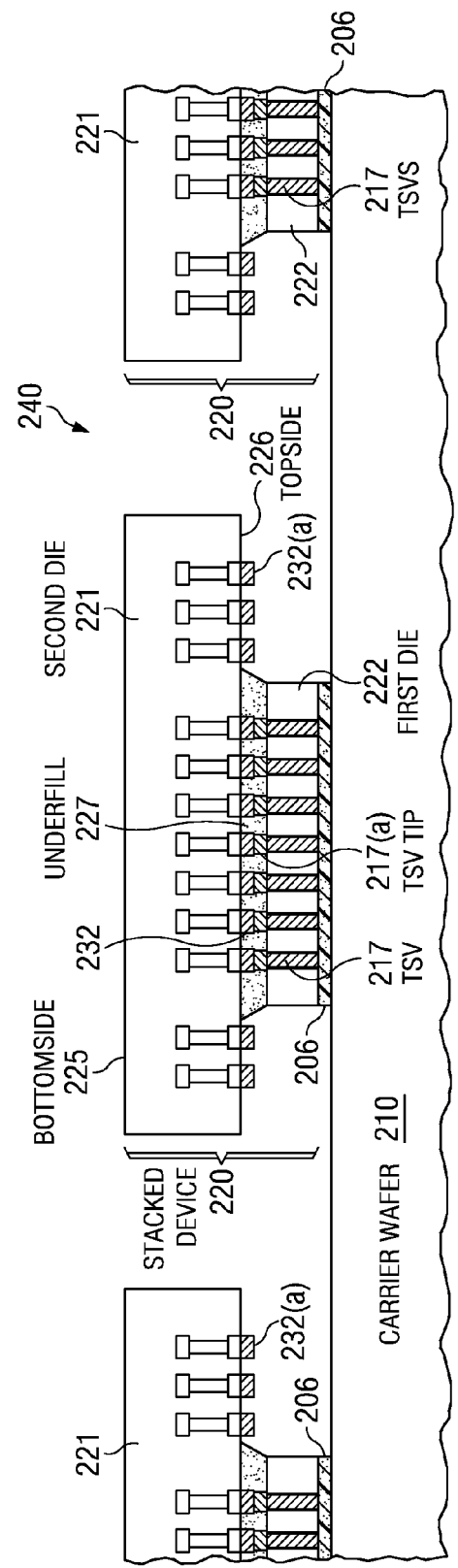
FIG. 2B is a cross sectional depiction of the arrangement having second semiconductor die bonded topside down onto first semiconductor die to form a plurality of stacked die devices on the carrier wafer, according to an example embodiment.

FIG. 2B is a cross sectional depiction of the arrangement 240 having second semiconductor die 221 bonded topside down onto first semiconductor die 222 to form a plurality of stacked die devices 220 on the carrier wafer 210. The second semiconductor die 221 is shown larger in width than the first semiconductor die 222, and the topside 226 of the second semiconductor die 221 includes bond pads 232 including some periphery bond pads 232(a) that extend beyond an area of the first semiconductor die 222. The bottomside of the second semiconductor die is shown as 225. Underfill 227 is shown between the first semiconductor die 222 and the second semiconductor die 221. Underfill 227 can be applied before or after bonding the first semiconductor die 222 to the second semiconductor die 221 (step 102).

Figure 2C:
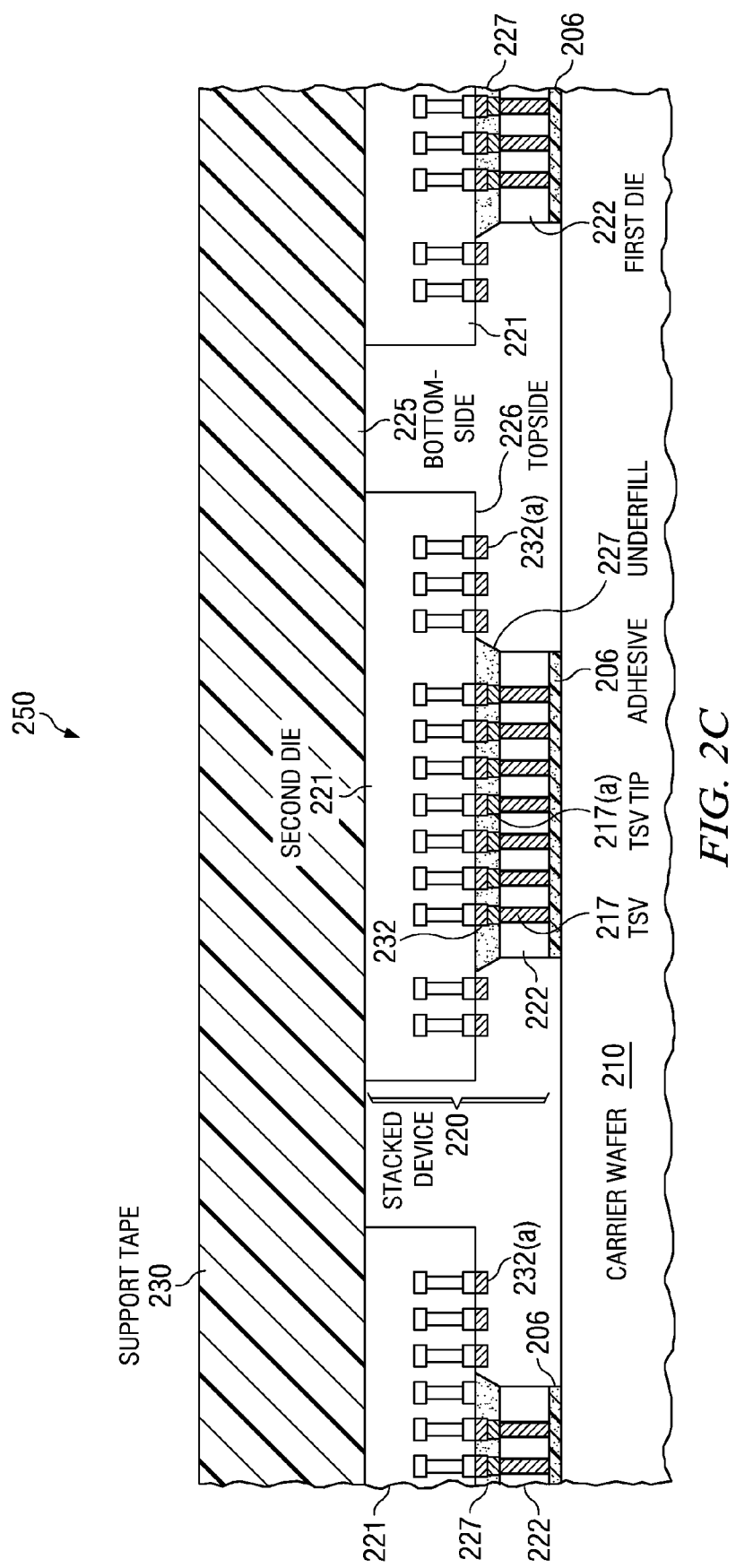
FIG. 2C is a cross sectional depiction of the arrangement following attaching a support tape to a bottomside of the plurality of second semiconductor die, according to an example embodiment.

Step 103 comprises attaching a support tape 230 to a bottomside 225 of the plurality of second semiconductor die 221. As used herein, a "support tape" is defined broadly to include more than simply tape materials so as to also include a wide variety of adhering arrangements, such as a support film that can be applied with a temporary adhesive to a semi-flexible support material. FIG. 2C is a cross sectional depiction of the arrangement 250 following step 103 comprising a plurality of stacked die devices 220 comprising a second semiconductor die 221 bonded to first semiconductor die 222 on the wafer 210, with a support tape 230 attached to the bottomside 225 of the plurality of second semiconductor die 221.

Figure 5A:
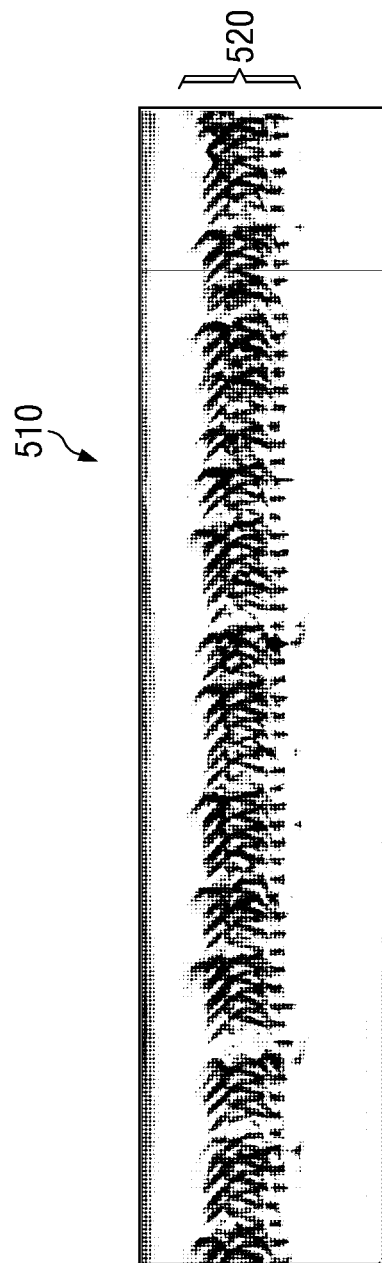
FIGS. 5A and 5B are scanned images of the edge of a silicon die following disclosed laser-assisted cleaving showing characteristic micro cracks following a 1-pass and a 2-pass laser irradiation process, respectively, according to an example embodiment.
Figure 5B:
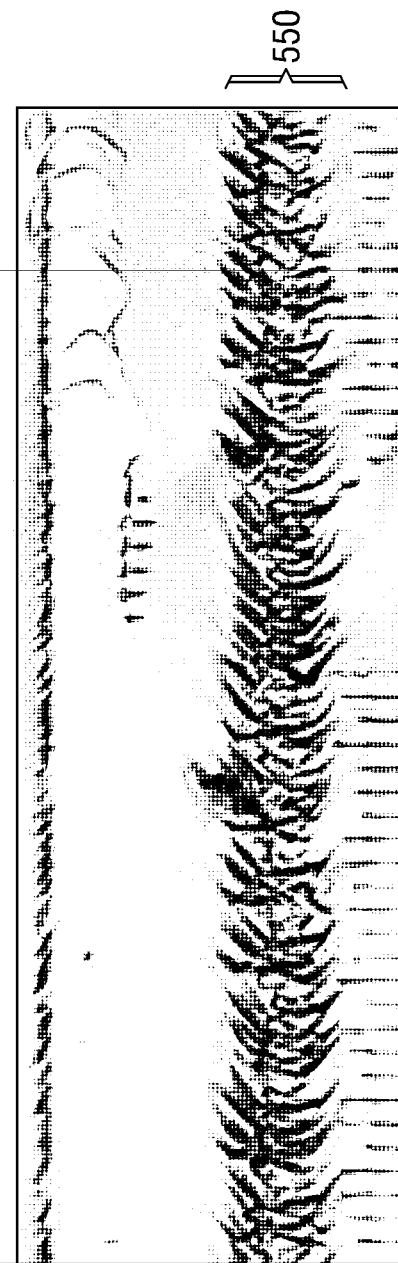

Step 104 comprises laser irradiating the carrier wafer 210 under conditions (e.g., power, focal length, time) to mechanically weaken the carrier wafer 210 but not ablate or cut through intended dicing lanes 211 in the carrier wafer that align with gaps between the plurality of first semiconductor die 222, so that the carrier remains a single whole wafer following the laser irradiation. The laser irradiating conditions includes laser alignment selected so that the carrier wafer 210 is damaged in the dicing lanes 211 just beyond (e.g., within 2 mm of) the periphery of first semiconductor die 222, yet does not damage overhanging regions of second semiconductor die 221. FIGS. 5A and 5B described below show scanned optical images of example silicon wafer edges along a dicing lane 211 after disclosed laser irradiation and subsequent cleaving.

Figure 2D:
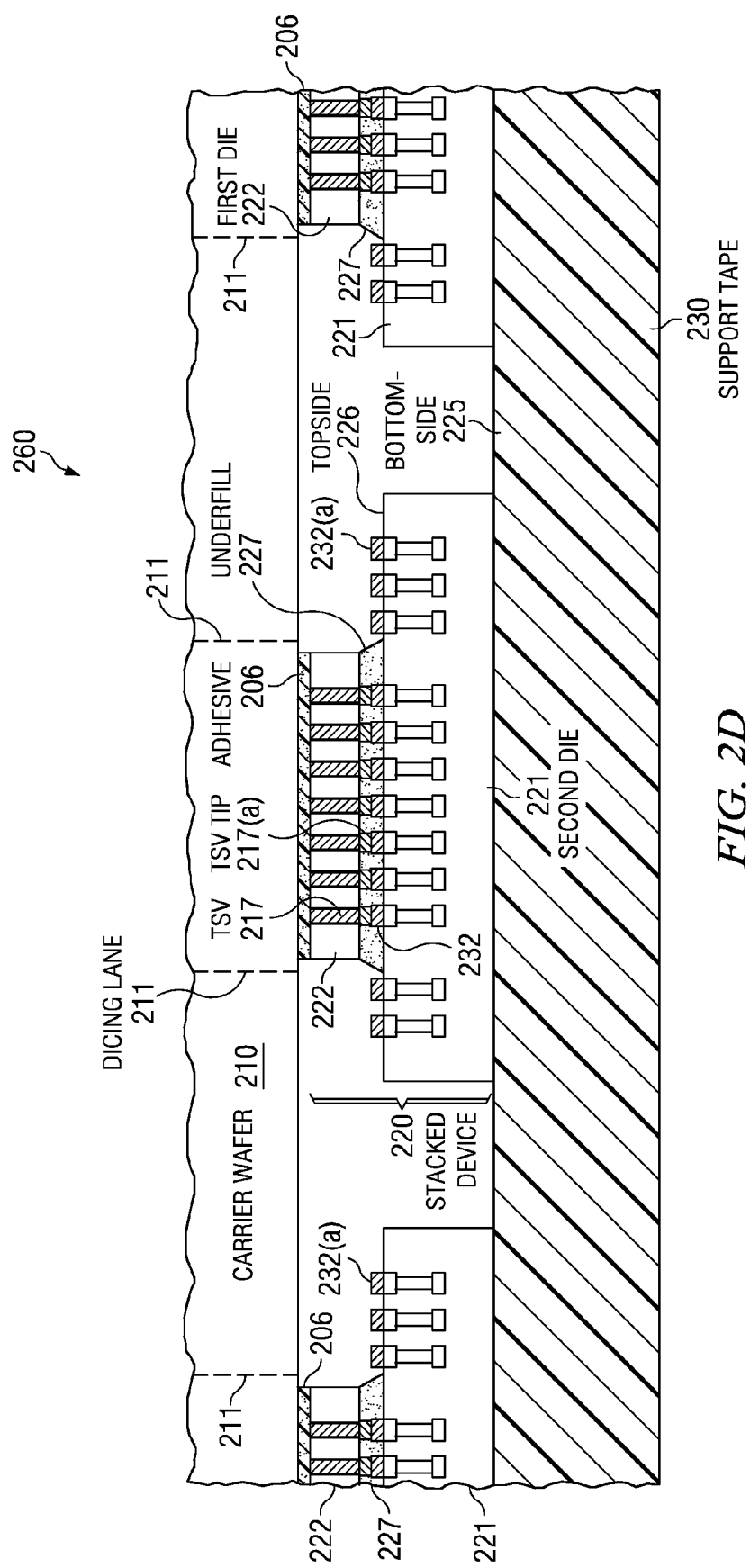
FIG. 2D is a cross sectional depiction of the resulting arrangement following laser irradiating step for the embodiment where dicing tape is applied to the wafer after laser irradiating.

FIG. 2D is a cross sectional depiction of the resulting arrangement 260 following laser irradiating step 104 for the embodiment where the dicing tape is applied to the carrier wafer after laser irradiating. Dashes in the carrier wafer 210 in the dicing lanes 211 are used to indicate laser induced damage. As shown in FIG. 2D, the resulting arrangement 260 was flipped 180 degrees to facilitate laser irradiating the carrier wafer 210.

Figure 2E:
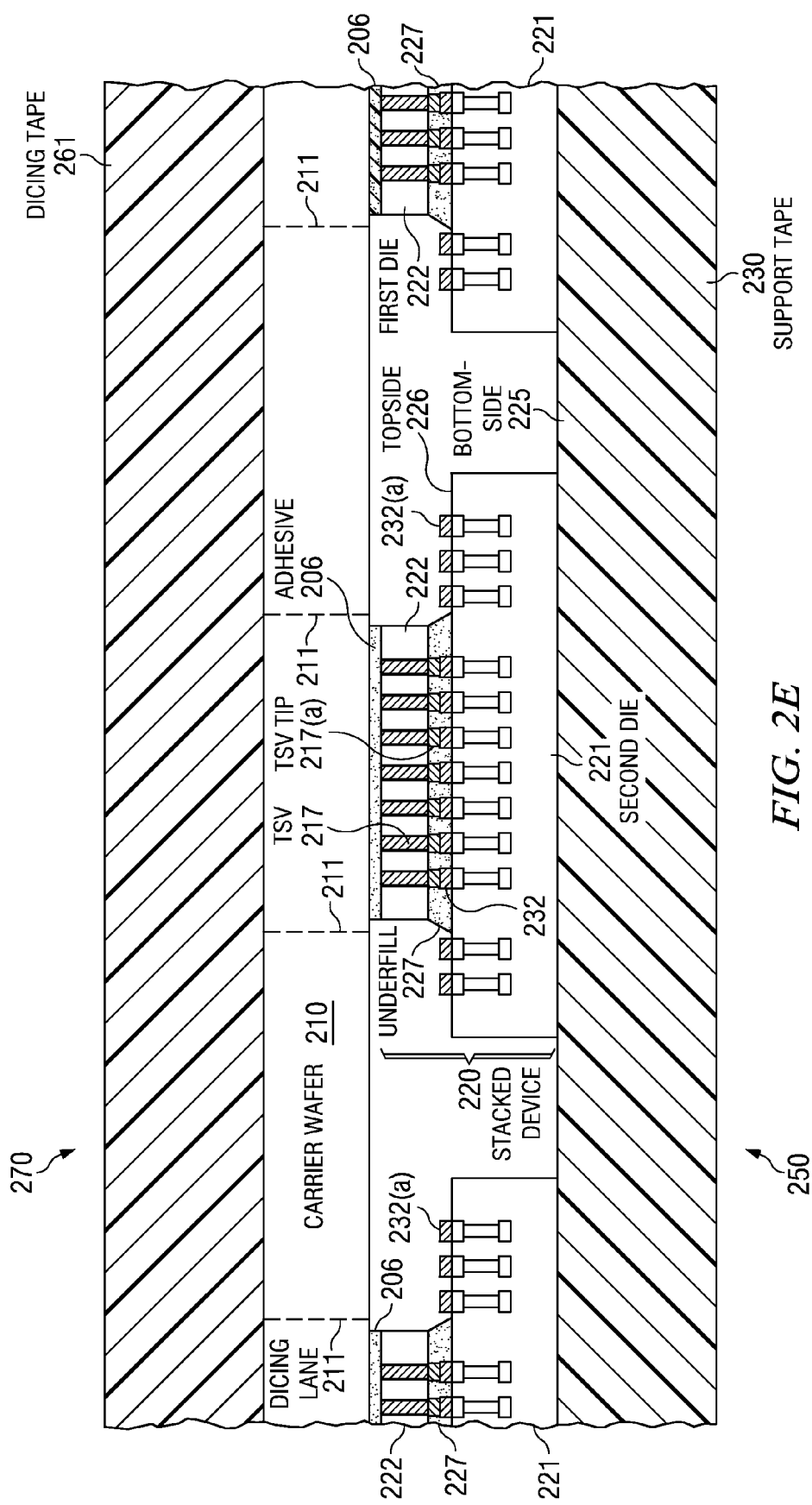
FIG. 2E is a cross sectional depiction of the resulting arrangement following attachment of the dicing tape after laser irradiating, according to an example embodiment.

Step 105 comprises attaching a dicing tape 261 to the wafer 210 opposite the stacked devices 220. Step 105 generally comprises applying the dicing tape along with a tape frame. Attaching of the dicing tape can take place before or after laser irradiating (step 104). When the dicing tape 261 is applied before laser irradiating, since the laser irradiation is through the dicing tape, the dicing tape is selected so that it is transmissive to the wavelength used for laser irradiating, which is typically an infrared (IR) wavelength, so that the dicing tape is selected to be IR transmissive/transparent. FIG. 2E is a cross sectional depiction of the resulting arrangement 270 following attachment of the dicing tape 261 for the embodiment the dicing tape is applied to the carrier wafer after laser irradiating.

Step 106 comprises pulling/stretching the dicing tape 261 to cleave the wafer along the intended dicing lanes 211 to form gaps 210(b), resulting in a plurality of singulated portions having stacked devices on wafer portions that each remains attached to the dicing tape, according to an example embodiment. A suitable machine can be used for pulling the dicing tape 261, such as commercially available separators, which are generally integrated together with the laser for laser irradiation (step 104). The support tape 230 is removed prior to the cleaving/separation, which generally occurs while pulling/stretching the dicing tape 261.

Figure 2F:
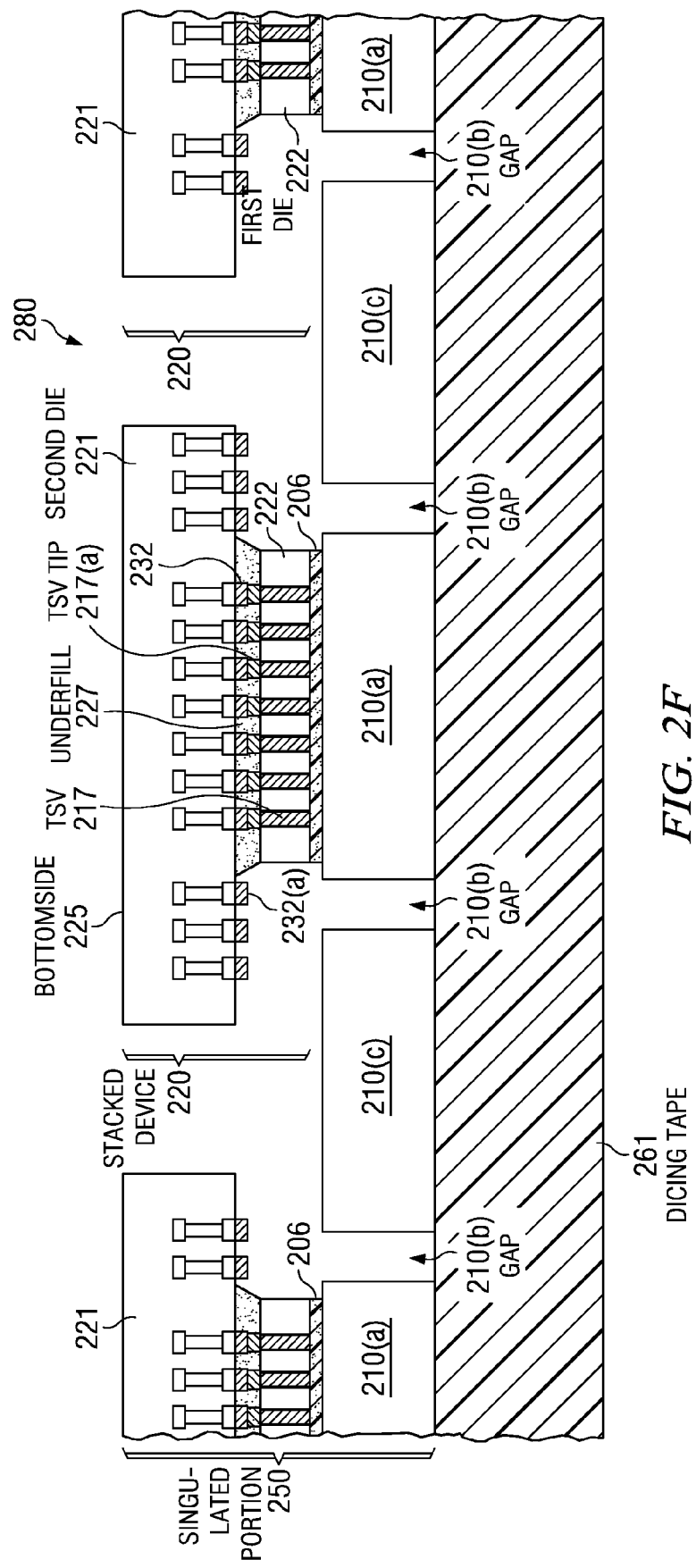
FIG. 2F is a cross sectional depiction of the arrangement following pulling the dicing tape to cleave the wafer along the intended dicing lanes into a plurality of singulated portions that shows a carrier wafer severed along the dicing lanes into a plurality of carrier portions that each remain attached to the dicing tape, according to an example embodiment.

FIG. 2F is a cross sectional depiction of the arrangement 280 following pulling the dicing tape to cleave (separate) the carrier wafer 210 along the intended dicing lanes 211 to form gaps 210(b), resulting in a plurality of singulated portions 250 that comprise wafer portions shown as carrier portions 210(a) each having a stacked device 220 thereon that remains attached to the dicing tape 261, according to an example embodiment. Unconnected carrier portions 210(c) between carrier portions 210(a) can be seen in FIG. 2F that are formed when portions of the carrier wafer that do not include stacked devices 220 are pulled in step 106. Unconnected carrier portions 210(c) are discarded.

Figure 3A:
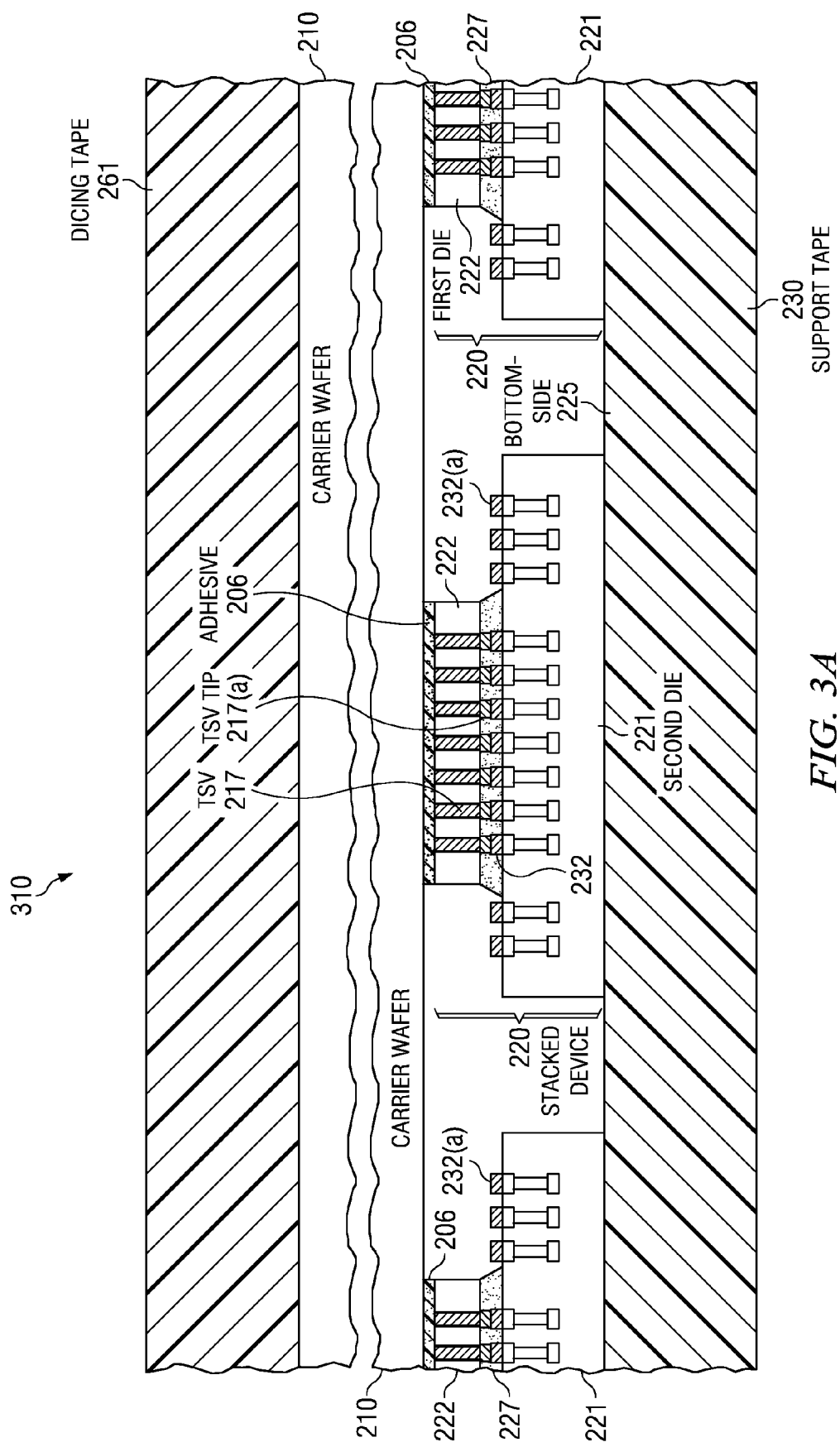
FIG. 3A is a cross sectional depiction showing the arrangement resulting after flipping the arrangement shown in FIG. 2C and attaching a dicing tape to the carrier wafer, for an alternate embodiment where the dicing tape is applied before laser irradiating, according to an example embodiment.
Figure 3B:
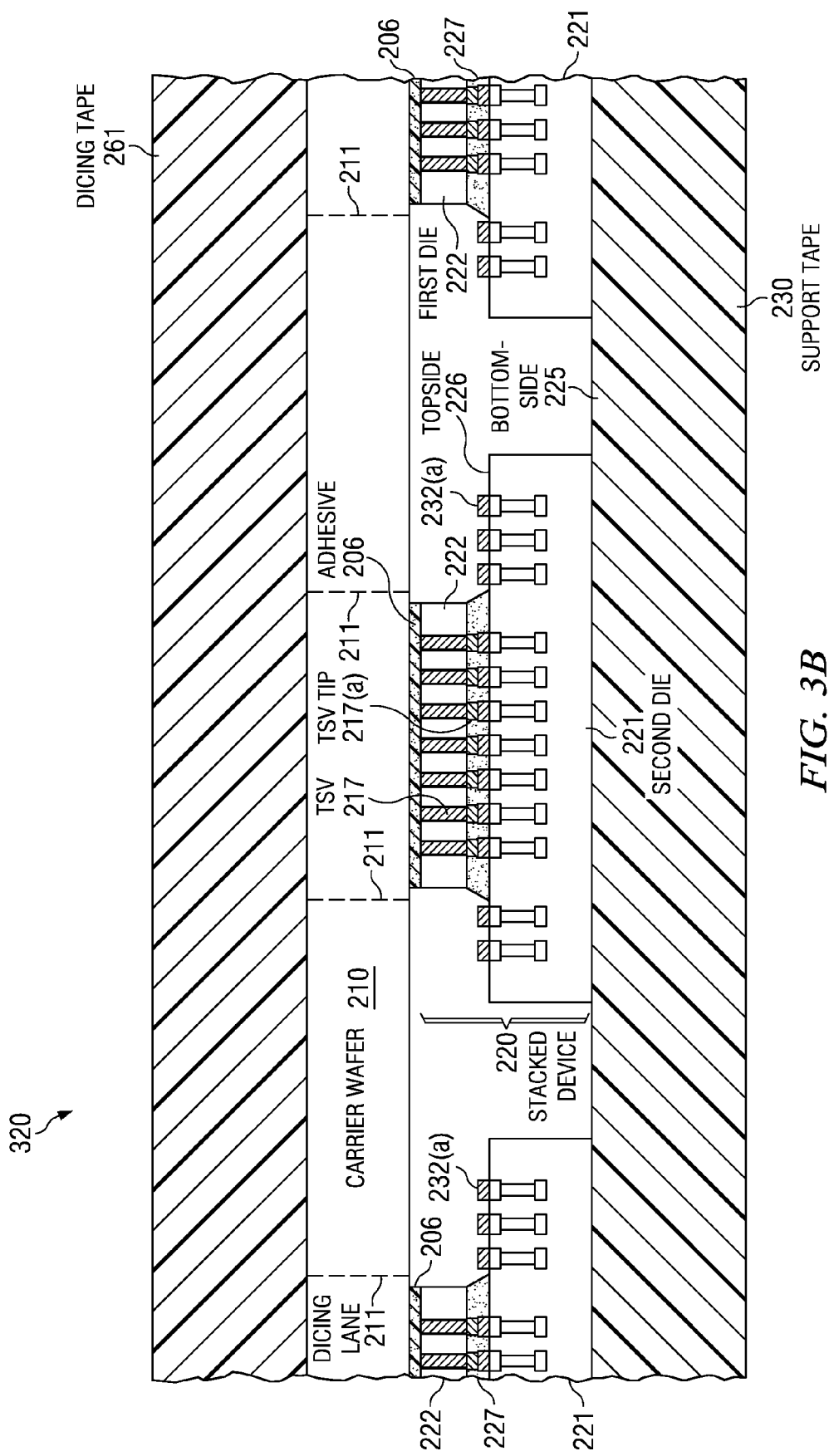
FIG. 3B is a cross sectional depiction showing the arrangement resulting after laser irradiating through the dicing tape, according to an example embodiment.
Figure 3C:
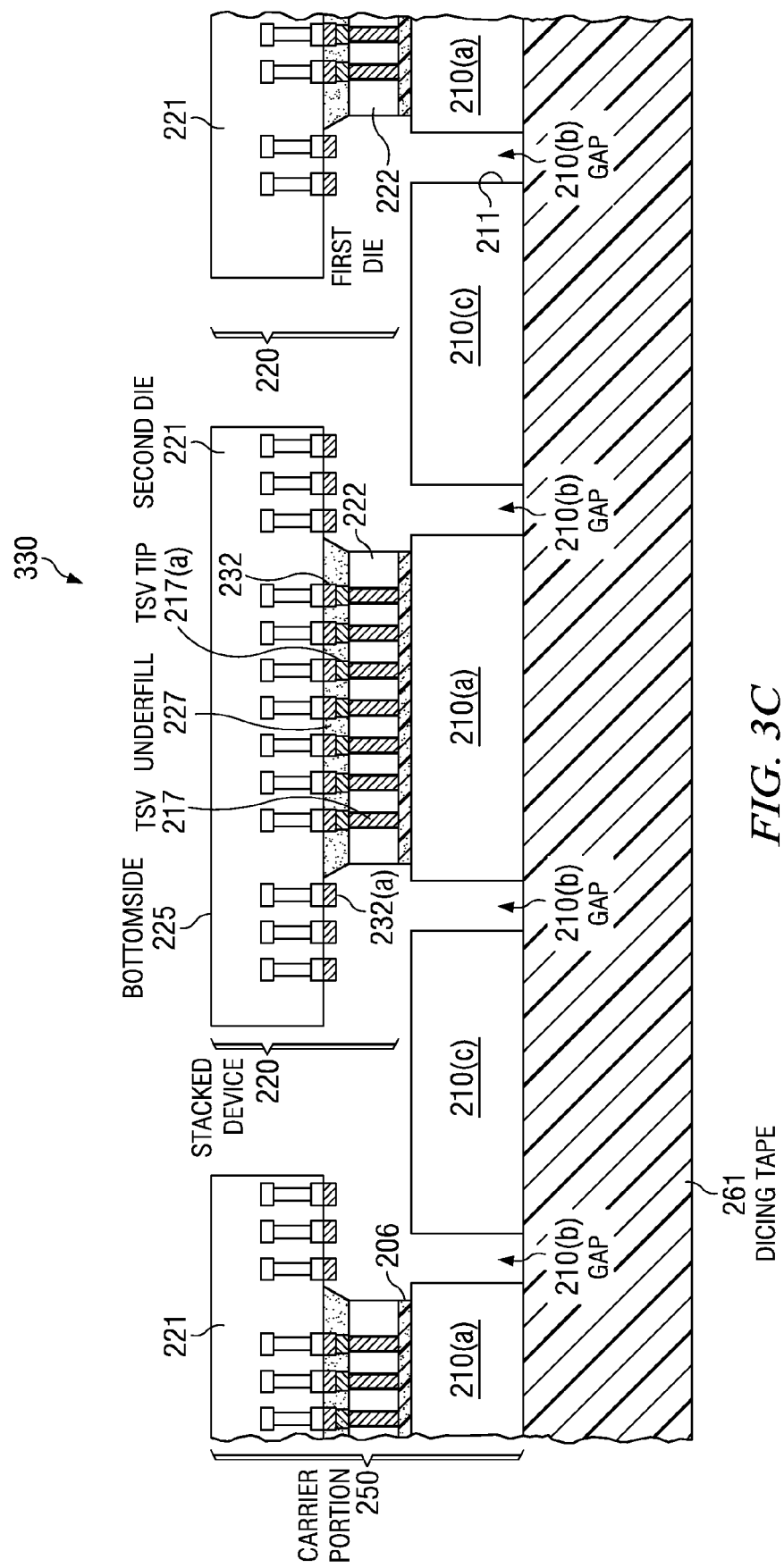
FIG. 3C is a cross sectional depiction showing the arrangement resulting after pulling the dicing tape to cleave the carrier wafer along the intended dicing lanes into a plurality of singulated portions that comprise carrier portions each having a stacked device thereon that remains attached to the dicing tape, according to an example embodiment.

As described above, the dicing tape 261 can be applied before or after laser irradiating (step 104). FIGS. 3A-C show cross sectional depictions of the resulting arrangements after steps for the alternate embodiment where the dicing tape 261 is applied before laser irradiating. In this embodiment the dicing tape is transmissive to the wavelength of the laser used for laser irradiation, typically an IR wavelength, so that dicing tape in this embodiment can comprise an IR-transparent dicing tape 261.

FIG. 3A is a cross sectional depiction showing arrangement 310 resulting after flipping arrangement 250 shown in FIG. 2C and attaching a dicing tape 261 to the carrier wafer 210. No dicing lanes 211 are shown in FIG. 3A since this depiction is shown before laser irradiating. Arrangement 310 is then laser irradiated through the dicing tape 261 in this embodiment, with the resulting arrangement 320 shown in FIG. 3B. Since the dicing tape 261 is transmissive to the wavelength of the laser used for laser irradiation, laser damage in the dicing lanes 211 occurs, which is shown as dashes in the carrier. FIG. 3C is a cross sectional depiction showing the arrangement 330 resulting after pulling the dicing tape 261 to cleave the carrier wafer 210 along the intended dicing lanes 211 to form gaps 210(b), resulting in a plurality of singulated portions 250 that comprise carrier portions 210(a) each having a stacked device 220 thereon, and unconnected carrier portions 201(c) that remain attached to the dicing tape 261, according to an example embodiment. Thus, the gaps 210(b) formed occur under the region of the second semiconductor die 221 that extends beyond the perimeter or boundary of the first semiconductor die 222. As described above, the support tape 230 is removed prior to cleaving/separation, which generally occurs while pulling/stretching the dicing tape 261.

As described above, the wafer can comprise a plurality of interposer die that each includes a plurality of TSVs, where after pulling the dicing tape (step 106) the plurality of interposer die become part of the plurality of singulated portions. The interposer die can comprise silicon interposer die, where after pulling/stretching the dicing tape, the edges of the interposer die for the plurality of singulated carrier portions include laser damaged regions that include micro cracks and a plurality of polysilicon crystallites. The wafer can also comprise a plurality of glass interposer die and wherein after the pulling edges of the plurality of singulated carrier portions include laser damaged regions that include a plurality of micro cracks.

Since disclosed methods eliminate the need for a conventional dicing blade needed for conventional stack die assembly, the periphery pads 232(a) of the second semiconductor die 221 are at much lower risk of being damaged or contaminated. As a result, disclosed methods improve wirebonding reliability to bond pads 232(a) on the second die for stacked die devices.

Figure 4:
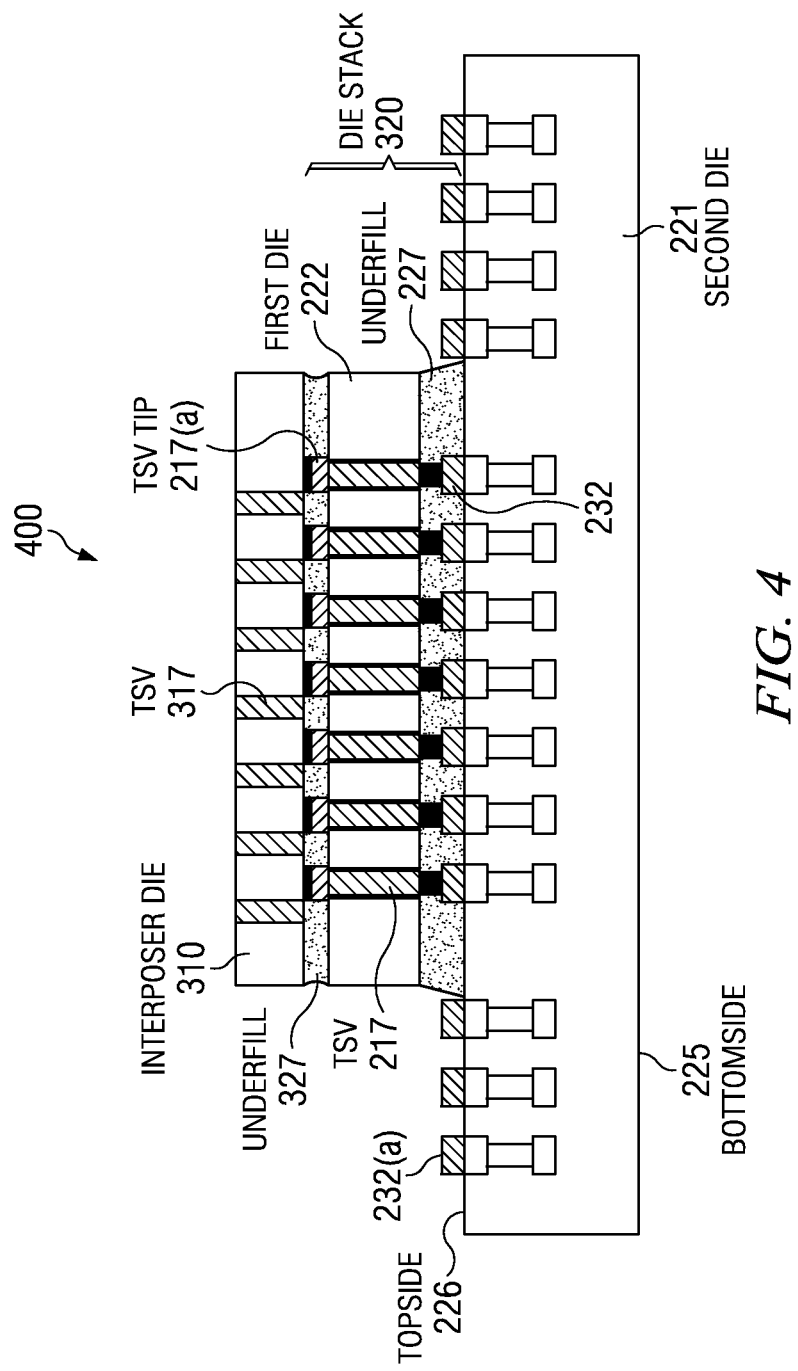
FIG. 4 is a cross sectional view of an example stacked die device formed by a disclosed method including laser-assisted cleaving of a reconstituted wafer, where the wafer comprises an interposer, according to an example embodiment.

Disclosed laser-assisted cleaving can produce stacked die devices that have certain distinguishable final features related to disclosed laser-assisted cleaving processing. For example, FIG. 4 is a cross sectional depiction of an example stacked die device 400. Stacked die device 400 comprises an interposer die 310, shown as a silicon interposer die 310 including a plurality of TSVs 317 with no active circuitry, and a die stack 320 that comprises a second semiconductor die 221 bonded to first semiconductor die 222 on the interposer die 310, wherein the second semiconductor die 221 is bonded with its topside 226 down onto the first semiconductor die 222. Edges of the interposer die 310 include laser damaged regions, such as shown in damage region in FIGS. 5A and 5B described below.

The second semiconductor die 221 can be seen to be larger in width as compared to the first semiconductor die 222 and the topside 226 of the second semiconductor die 221 includes bond pads 232(a) that extend beyond an area of the first semiconductor die 222. The first semiconductor die 222 includes a plurality of TSVs 217 having protruding TSV tips 217(a). A redistribution layer (RDL) may be used to route from TSVs 317 to pads that line up to TSV tips 217(a). Underfill 327 is shown between the interposer die 310 and the first semiconductor die 222.

FIGS. 5A and 5B are scanned optical images of the edge of a silicon die from a silicon wafer after disclosed laser-assisted cleaving showing micro cracks following a 1-pass and a 2-pass laser process, respectively, according to an example embodiment. The die 510 shown in FIG. 5A is 60 μm thick, and laser induced micro-cracks can be seen in the laser damaged region 520 shown. The die 540 shown in FIG. 5B is 75 μm thick, and laser induced micro-cracks can be seen in the laser damaged region 550 shown. Two (2) micro-crack regions indicative of the two passes of laser being focused at two different levels can be seen. The top region is much smaller in micro crack width vs. the lower region. Although the scanned images are shown for silicon substrates, glass substrates, such as for quartz interposers are expected to have analogous micro cracks resulting from disclosed laser-assisted cleaving.

Disclosed embodiments can be integrated into a variety of assembly flows to form a variety of different stacked die devices and related products. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, CMOS, BiCMOS and MEMS.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure. For example, the first semiconductor die 222, second semiconductor 221, or both the first semiconductor die 222 and second semiconductor 221 can be multi-die stacks.

We claim:

1. A stacked die device, comprising:
   an interposer die including a plurality of through substrate vias (TSVs), and
   a die stack attached to said interposer, wherein said die stack includes:
   a second semiconductor die having a topside with a plurality of bond pads thereon with said topside down onto a first semiconductor die that has a plurality of TSVs, wherein said plurality of TSVs on said first semiconductor die are bonded to a portion of said plurality of bond pads of said second semiconductor die, wherein edges of said interposer die include laser damaged regions.

2. The stacked die device of claim 1, wherein said interposer die comprises a silicon interposer die and wherein said laser damaged regions include a plurality of micro cracks.

3. The stacked die device of claim 1, wherein said interposer die comprises a glass interposer die and wherein said laser damaged regions include a plurality of micro cracks.

4. The stacked die device of claim 1, wherein said second semiconductor die extends beyond a perimeter or boundary of said first semiconductor die and wherein said topside of said second semiconductor die includes bond pads that extend beyond said perimeter or said boundary of said first semiconductor die.

5. The stacked die device of claim 1, further comprising underfill between said first semiconductor die and said second semiconductor die.

6. The stacked die device of claim 1, wherein said laser damaged regions are only in a portion of a width of said interposer die.

7. The stacked die device of claim 1, wherein said plurality of TSVs on said first semiconductor die include protruding TSV tips bonded to said interposer die.

8. The stacked die device of claim 1, wherein said first semiconductor die and said second semiconductor die both comprise integrated circuit die.

9. The stacked die device of claim 1, wherein said plurality of bond pads of said second semiconductor die include periphery bond pads that extend beyond an area of said first semiconductor die and are not connected to said first semiconductor die.

* * * * *